United States Patent
Ahn et al.

(10) Patent No.: US 9,054,003 B2
(45) Date of Patent: Jun. 9, 2015

(54) IMAGE SENSORS AND METHODS OF FABRICATING THE SAME

(71) Applicant: Samsung Electronics Co., Ltd., Suwon-Si, Gyeonggi-Do (KR)

(72) Inventors: Jungchak Ahn, Yongin-si (KR); Kyungho Lee, Suwon-si (KR); Heegeun Jeong, Suwon-si (KR); Sangjun Choi, Seoul (KR); Jongeun Park, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 13/785,056

(22) Filed: Mar. 5, 2013

(65) Prior Publication Data

US 2013/0307040 A1 Nov. 21, 2013

(30) Foreign Application Priority Data

May 18, 2012 (KR) ........................ 10-2012-0053265

(51) Int. Cl.
    *H01L 27/146* (2006.01)
(52) U.S. Cl.
    CPC ........ *H01L 27/1463* (2013.01); *H01L 27/14621* (2013.01); *H01L 27/14627* (2013.01); *H01L 27/14638* (2013.01); *H01L 27/14641* (2013.01); *H01L 27/14643* (2013.01)
(58) Field of Classification Search
    CPC ................ H01L 27/1463; H01L 27/14627; H01L 27/1464
    USPC ........................................ 257/432, 291, 292
    See application file for complete search history.

(56) References Cited

U.S. PATENT DOCUMENTS

| | | | |
|---|---|---|---|
| 7,217,968 B2 | 5/2007 | Adkisson et al. | |
| 7,750,392 B2 | 7/2010 | Mouli | |
| 7,768,047 B2 | 8/2010 | Mauritzson et al. | |
| 8,105,861 B2 | 1/2012 | Adkisson et al. | |
| 8,115,236 B2 | 2/2012 | Kumesawa | |
| 2006/0124976 A1 | 6/2006 | Adkisson et al. | |
| 2006/0138486 A1 | 6/2006 | Lim | |
| 2007/0018273 A1* | 1/2007 | Miller et al. | 257/506 |
| 2008/0265363 A1* | 10/2008 | Gambino et al. | 257/510 |
| 2008/0277693 A1 | 11/2008 | Mauritzson et al. | |
| 2009/0200625 A1* | 8/2009 | Venezia et al. | 257/432 |
| 2009/0219426 A1 | 9/2009 | Mouli | |
| 2010/0214454 A1* | 8/2010 | Kikuchi | 348/272 |
| 2010/0283086 A1 | 11/2010 | Lee et al. | |
| 2010/0295019 A1 | 11/2010 | Wang et al. | |
| 2010/0320507 A1* | 12/2010 | Uya | 257/228 |
| 2011/0008925 A1 | 1/2011 | Adkisson et al. | |

(Continued)

FOREIGN PATENT DOCUMENTS

| | | |
|---|---|---|
| JP | 2011014751 A | 1/2011 |
| JP | 2011044544 A | 3/2011 |

(Continued)

*Primary Examiner* — David Vu
*Assistant Examiner* — Jonathan Han
(74) *Attorney, Agent, or Firm* — Harness, Dickey & Pierce, P.L.C.

(57) ABSTRACT

Provided are image sensors and methods of fabricating the same. The image sensor has a transfer gate, which may be configured to include a buried portion having a flat bottom surface and a rounded lower corner. This structure of the buried portion enables to transfer electric charges stored in the photoelectric conversion part effectively.

20 Claims, 20 Drawing Sheets

(56) References Cited

U.S. PATENT DOCUMENTS

| | | |
|---|---|---|
| 2011/0084322 A1 | 4/2011 | Kang |
| 2011/0089311 A1 | 4/2011 | Venezia et al. |
| 2011/0108897 A1* | 5/2011 | Koo et al. .................... 257/292 |
| 2011/0139963 A1* | 6/2011 | Krymski ................... 250/208.1 |
| 2011/0163361 A1 | 7/2011 | Kumesawa |
| 2011/0175187 A1* | 7/2011 | Ueno et al. ................... 257/437 |
| 2011/0187911 A1 | 8/2011 | Shinohara |
| 2011/0220976 A1* | 9/2011 | Iida et al. ..................... 257/291 |
| 2012/0043589 A1* | 2/2012 | Nozaki et al. ................ 257/225 |

FOREIGN PATENT DOCUMENTS

| | | |
|---|---|---|
| KR | 20020045165 A | 6/2002 |
| KR | 20060044088 A | 5/2006 |
| KR | 20070070429 A | 7/2007 |

* cited by examiner

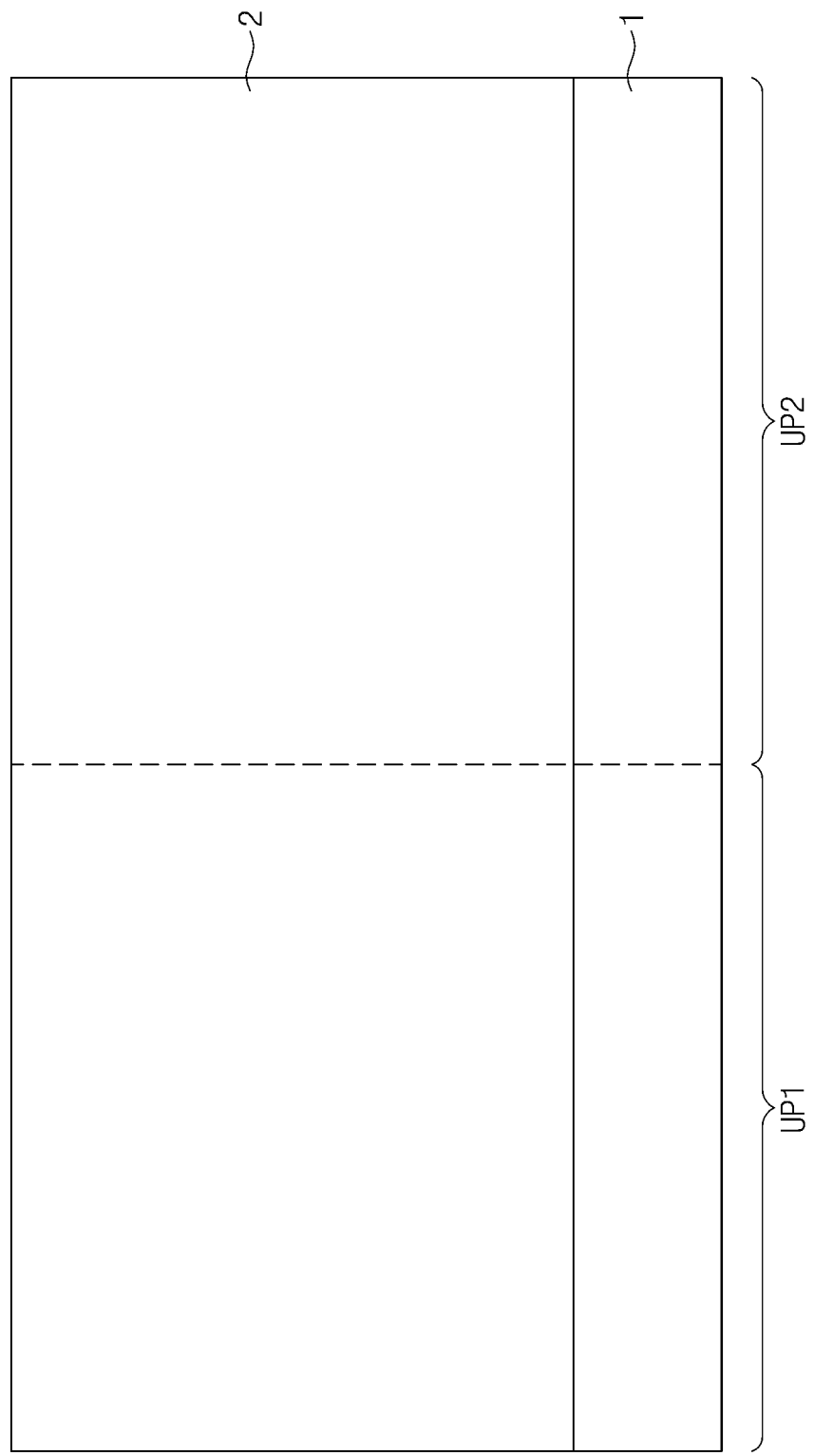

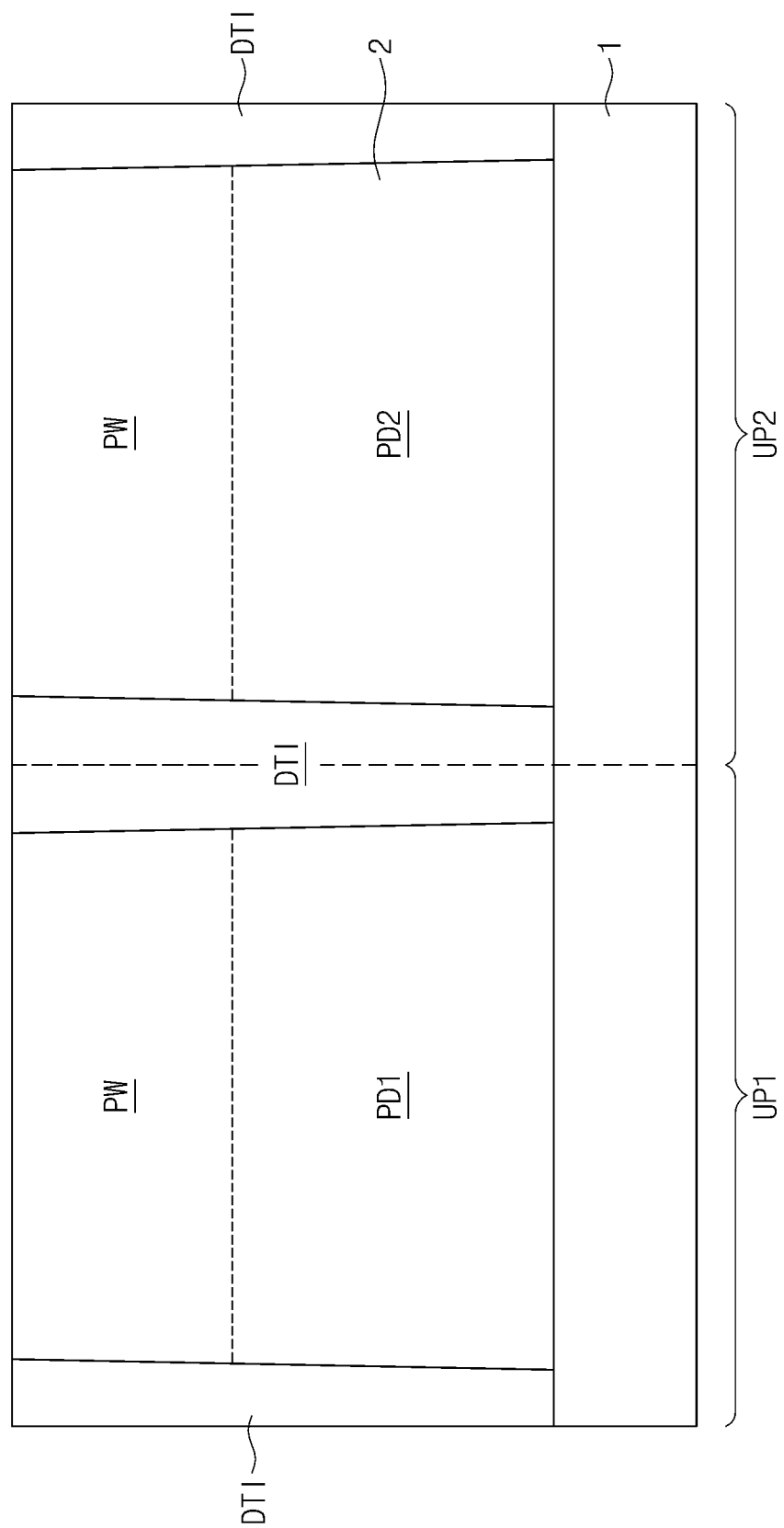

3000

IMAGE SENSORS AND METHODS OF FABRICATING THE SAME

CROSS-REFERENCE TO RELATED APPLICATIONS

This U.S. non-provisional patent application claims priority under 35 U.S.C. §119 to Korean Patent Application No. 10-2012-0053265, filed on May 18, 2012, in the Korean Intellectual Property Office, the entire contents of which are hereby incorporated by reference.

BACKGROUND OF THE INVENTION

Example embodiments of the inventive concepts relate to image sensors and methods of fabricating the same.

Some image sensors are semiconductor devices capable of converting electric signals into optical images. Image sensors may be classified into various types, including charge coupled device (CCD) type and complementary metal oxide semiconductor (CMOS) type. A CMOS image sensor (CIS) includes pixels arranged in two dimensions. Each of the pixels includes a photodiode (PD), which converts incident light into an electric signal.

As semiconductor devices become more highly integrated, semiconductor image sensors likewise become highly integrated. The corresponding pixels are therefore scaled down, such that cross talk may occur between pixels and image lag may occur more often.

SUMMARY

Embodiments of the inventive concepts provide a highly integrated image sensor capable of improving the image lag problem and a method of fabricating the same.

According to an example embodiment of the inventive concepts, an image sensor may include a substrate including first and second surfaces facing each other and a plurality of pixel regions, the plurality of pixel regions being configured such that, when the second surface is exposed to a light, the light is incident on the pixel regions through the second surface; photoelectric conversion parts formed in the pixel regions of the substrate, respectively; and gate electrodes provided on the photoelectric conversion parts, wherein at least one of the gate electrodes on at least one of the photoelectric conversion parts includes a buried portion in the substrate, the buried portion including a flat bottom surface and a rounded lower corner.

According to an example embodiment of the inventive concepts, the flat bottom surface of the buried portion has a width of 100 nm or more.

According to an example embodiment of the inventive concepts, the image sensor may further include a gate insulating layer interposed between the gate electrode and the substrate. The gate insulating layer may be spaced apart from the photoelectric conversion part.

According to an example embodiment of the inventive concepts, the image sensor may further include a deep device isolation layer penetrating the substrate to connect the first surface and the second surface with each other. The pixel regions may be separated from each other by the deep device isolation layer.

According to an example embodiment of the inventive concepts, the photoelectric conversion part may be formed to be in contact with a sidewall of the deep device isolation layer.

According to an example embodiment of the inventive concepts, the deep device isolation layer may include an insulating material, whose refractive index may be different from that of the substrate.

According to an example embodiment of the inventive concepts, the deep device isolation layer may further include a polysilicon layer inserted into the insulating material.

According to an example embodiment of the inventive concepts, the image sensor may further include a shallow device isolation layer provided adjacent to the first surface of the substrate. The shallow device isolation layer may be formed spaced apart from a top surface of the photoelectric conversion part.

According to an example embodiment of the inventive concepts, the image sensor may further include a floating diffusion region provided in the substrate and between sidewalls of the shallow device isolation layer and the gate electrode, and a well region provided in the substrate and between the floating diffusion region and the photoelectric conversion part.

According to an example embodiment of the inventive concepts, the floating diffusion region and the photoelectric conversion part have a first conductivity type, and the well region has a second conductivity type that may be opposite to the first conductivity type.

According to an example embodiment of the inventive concepts, at least two of the floating diffusion regions in adjacent ones of the pixel regions may be electrically connected to each other.

According to an example embodiment of the inventive concepts, the image sensor may further include color filters provided on the second surface, each of the color filters being disposed on the corresponding one of the pixel regions, and microlens provided on the color filters, respectively.

According to an example embodiment of the inventive concepts, the image sensor may further include a protection layer disposed between the color filter and the second surface.

According to an example embodiment of the inventive concepts, the protection layer may be configured to have negative fixed charges.

According to an example embodiment of the inventive concepts, a method of fabricating an image sensor may include forming a deep device isolation layer in a substrate to define pixel regions; forming photoelectric conversion parts in each of the pixel regions of the substrate; forming a well region on at least one of the photoelectric conversion parts; patterning the substrate such that a well region of the substrate defines a hole; and forming a gate electrode in the hole, wherein the hole is formed to have a flat bottom surface and a rounded lower corner, the rounded lower corner connecting side and bottom surfaces of the hole.

According to an example embodiment of the inventive concepts, an image sensor may include a substrate including a first surface, a second surface opposite the first surface, and a plurality of pixel regions, each of the pixel regions including, a photoelectric conversion region spaced apart from the first surface of the substrate, and a gate electrode on the first surface of the substrate, the gate electrode including a lower portion that extends into the substrate from the first surface of the substrate to the photoelectric conversion region, the lower portion of the gate electrode including a flat bottom surface and a rounded lower corner; and a deep device isolation layer extending through the substrate from the first surface to the second surface, the plurality of pixel regions being separated from each other by the deep device isolation layer.

According to an example embodiment of the inventive concepts, the image sensor may include a shallow device isolation layer adjacent to the first surface of the substrate and spaced apart from a top surface of the photoelectric conversion region, the top surface being a surface of the photoelectric conversion region closest to the gate electrode.

According to an example embodiment of the inventive concepts, each of the pixel regions may further include, a floating diffusion region, the floating diffusion region being in the substrate and between sidewalls of the shallow device isolation layer and the gate electrode; and a well region, the well region being in the substrate and between the floating diffusion region and the photoelectric conversion region.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

FIGS. 6 through 11 are sectional views illustrating a process of fabricating the image sensor of FIG. 3A.

Figure 1:
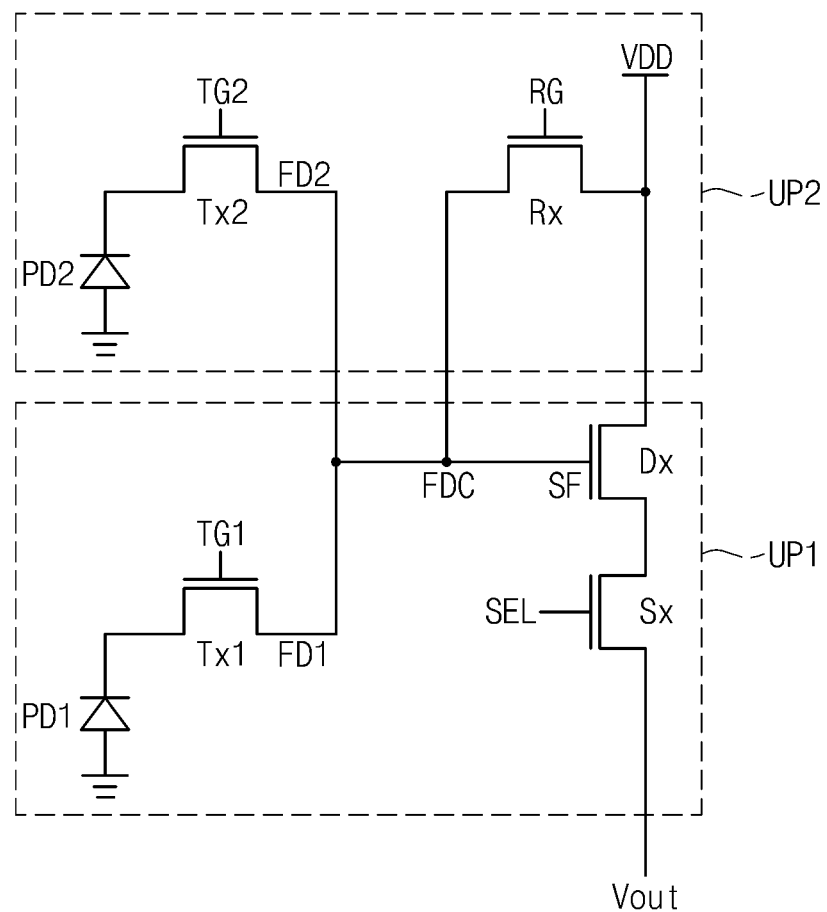
FIG. 1 is a circuit diagram of image sensors according to an example embodiment of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region foamed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a circuit diagram of image sensors according to an example embodiment of the inventive concepts.

Referring to FIG. 1, a first pixel region UP1 may be disposed adjacent to a second pixel region UP2. The first pixel region UP1 may include a first transfer transistor Tx1, a source follower transistor Dx, and a selection transistor Sx. The second pixel region UP2 may include a second transfer transistor Tx2 and a reset transistor Rx. The first transfer transistor Tx1 may include a first transfer gate TG1 and a first floating diffusion region FD1 and be connected to a first photodiode PD1. The second transfer transistor Tx2 may include a second transfer gate TG2 and a second floating diffusion region FD2 and be connected to a second photodiode PD2. The source follower transistor Dx, the selection transistor Sx, and the reset transistor Rx may include a source follower gate SF, a selection gate SEL, and a reset gate RG, respectively. The first and second pixel regions UP1 and UP2 may share the reset transistor Rx, the source follower transistor Dx, and the selection transistor Sx. The first floating diffusion region FD1 and the second floating diffusion region FD2 may be connected to each other by a wire W1 and be connected to a common floating diffusion node FDC.

An operation of the circuit will be described hereinafter.

A reset operation may be executed. In the reset operation, the reset transistor Rx may be turned on by elevating a voltage of the gate RG of the reset transistor Rx, and then, an electric potential of the common floating diffusion node FDC serving as a sensing node may be elevated to a power voltage VDD. Here, the electric potential of the common floating diffusion node FDC may be firstly sampled by the source follower transistor Dx and the selection transistor Sx to be set as a reference potential.

If a light from the outside is incident to the photo diodes PD1 and PD2, electron-hole pairs may be generated in proportion to an intensity of the incident light. Here, when the first transfer gate TG1 of the first transfer transistor Tx1 is applied with an elevated voltage, electric charges accumulated in the first photo diode PD1 may be transferred to the first floating diffusion region FD1 to change the electric potential of the common floating diffusion node FDC. For example, the electric potential of the common floating diffusion node FDC may be lowered in proportion to an amount of the electric charge transferred thereto, thereby changing an electric potential of a source region of the source follower transistor Dx. If the selection transistor Sx is turned on by applying an elevated voltage to the selection gate SEL, the changed electric potential of the source region of the source follower transistor Dx may be output to an output node Vout. A difference in electric potential between the reference potential and the outputting electric potential Vout may be used to sense an optical signal generated from the first photo diode PD1.

The reset operation may be executed again. If the second transfer gate TG2 of the second transfer transistor Tx2 is applied with an elevated voltage, electric charges accumulated in the second photo diode PD2 may be transferred into the second floating diffusion region FD2 to change the electric potential of the common floating diffusion node FDC. For example, the electric potential of the common floating diffusion node FDC may be lowered in proportion to an amount of the electric charge transferred thereto, thereby changing an electric potential of the source region of the source follower transistor Dx. If the selection transistor Sx is turned on by applying an elevated voltage to the selection gate SEL, the changed electric potential of the source region of the source follower transistor Dx may be output to the output node Vout. A difference in electric potential between the reference potential and the outputting electric potential Vout may be used to sense an optical signal generated from the second photo diode PD2.

Thereafter, the afore-described operation may be repeated from the reset operation.

Figure 2:
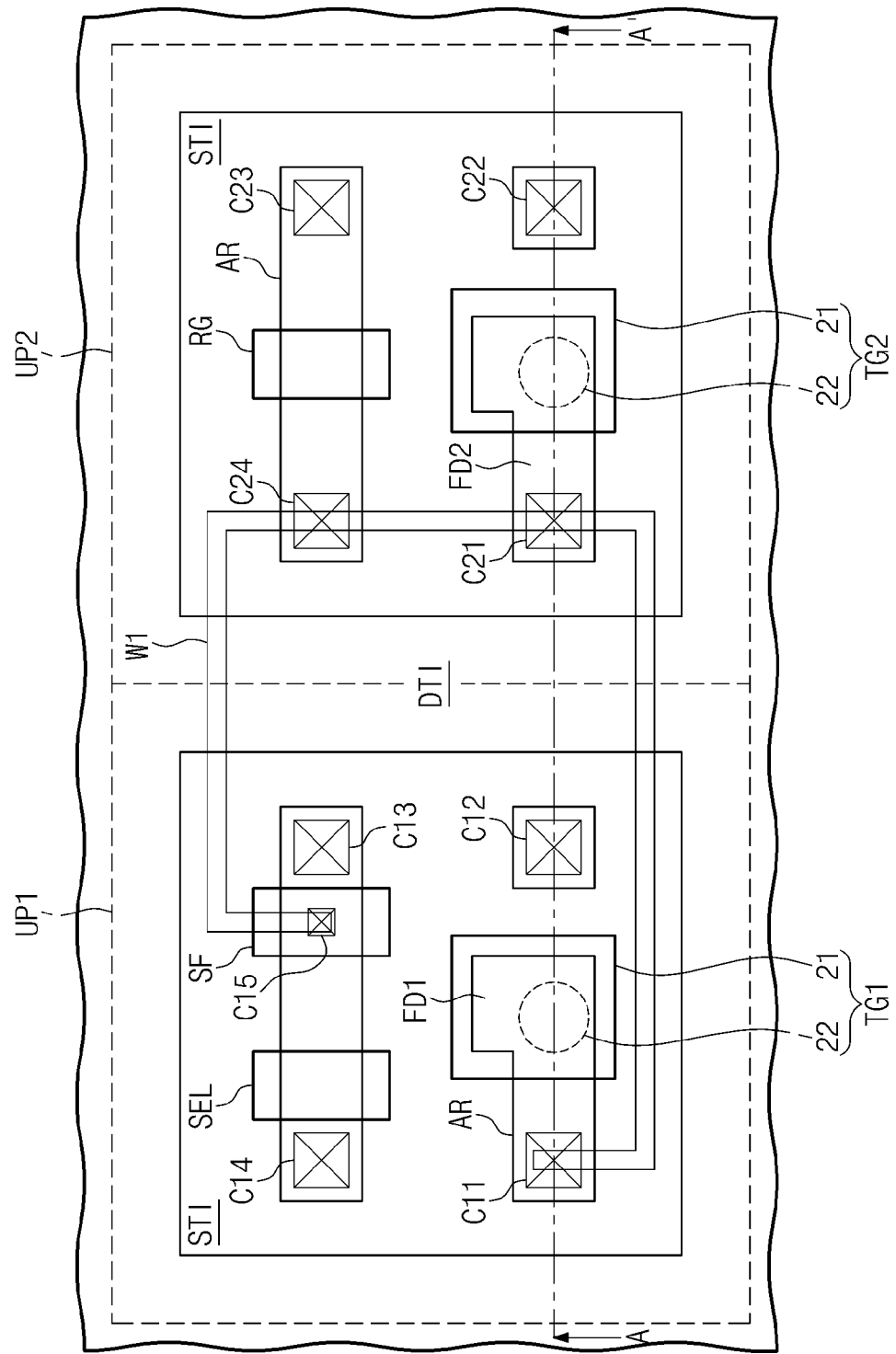
FIG. 2 is a layout illustrating an image sensor according to an example embodiment of the inventive concepts.
Figure 3A:
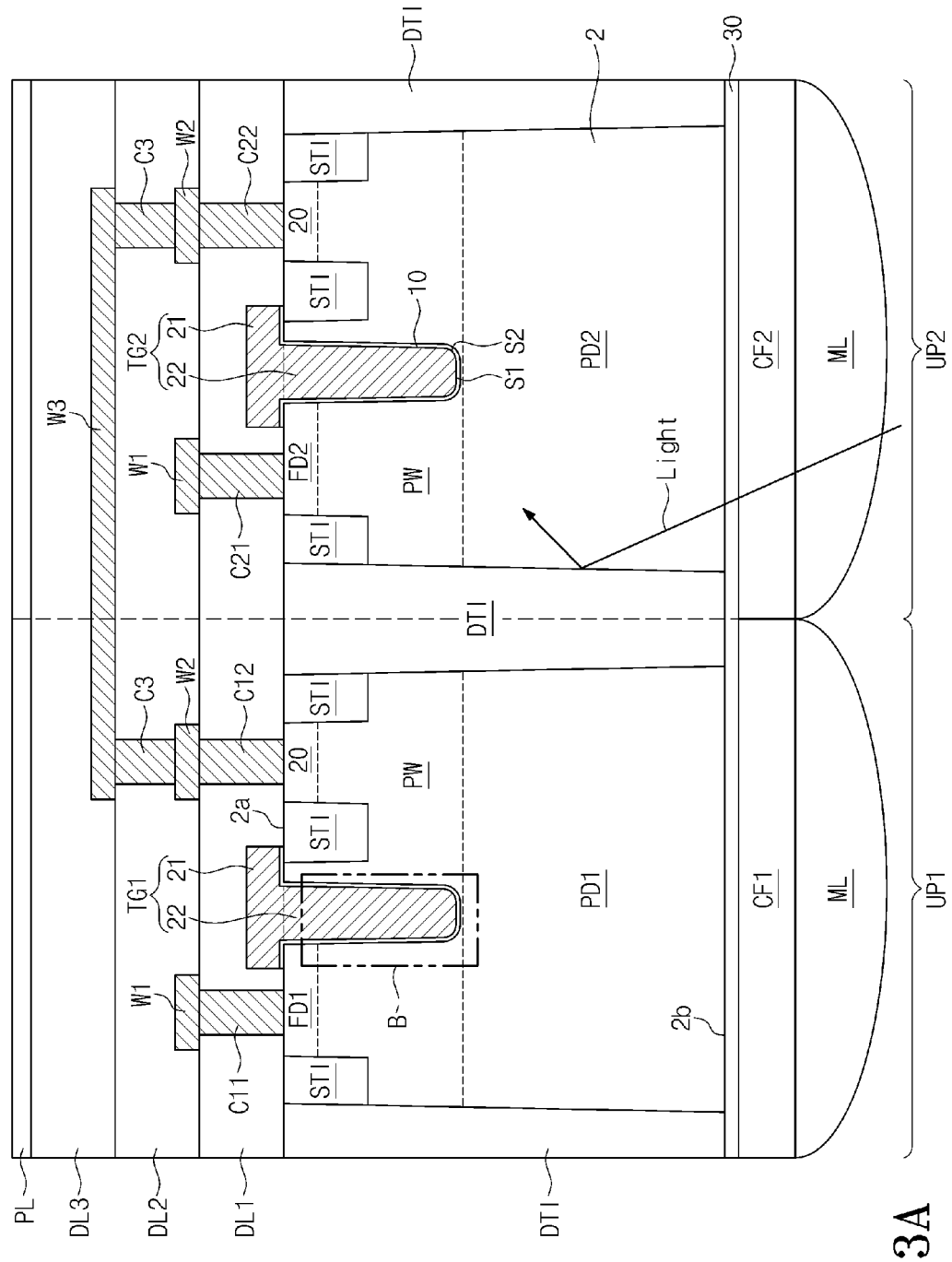
FIGS. 3A and 3B are sectional views taken along a line A-A' of FIG. 2.
Figure 3B:
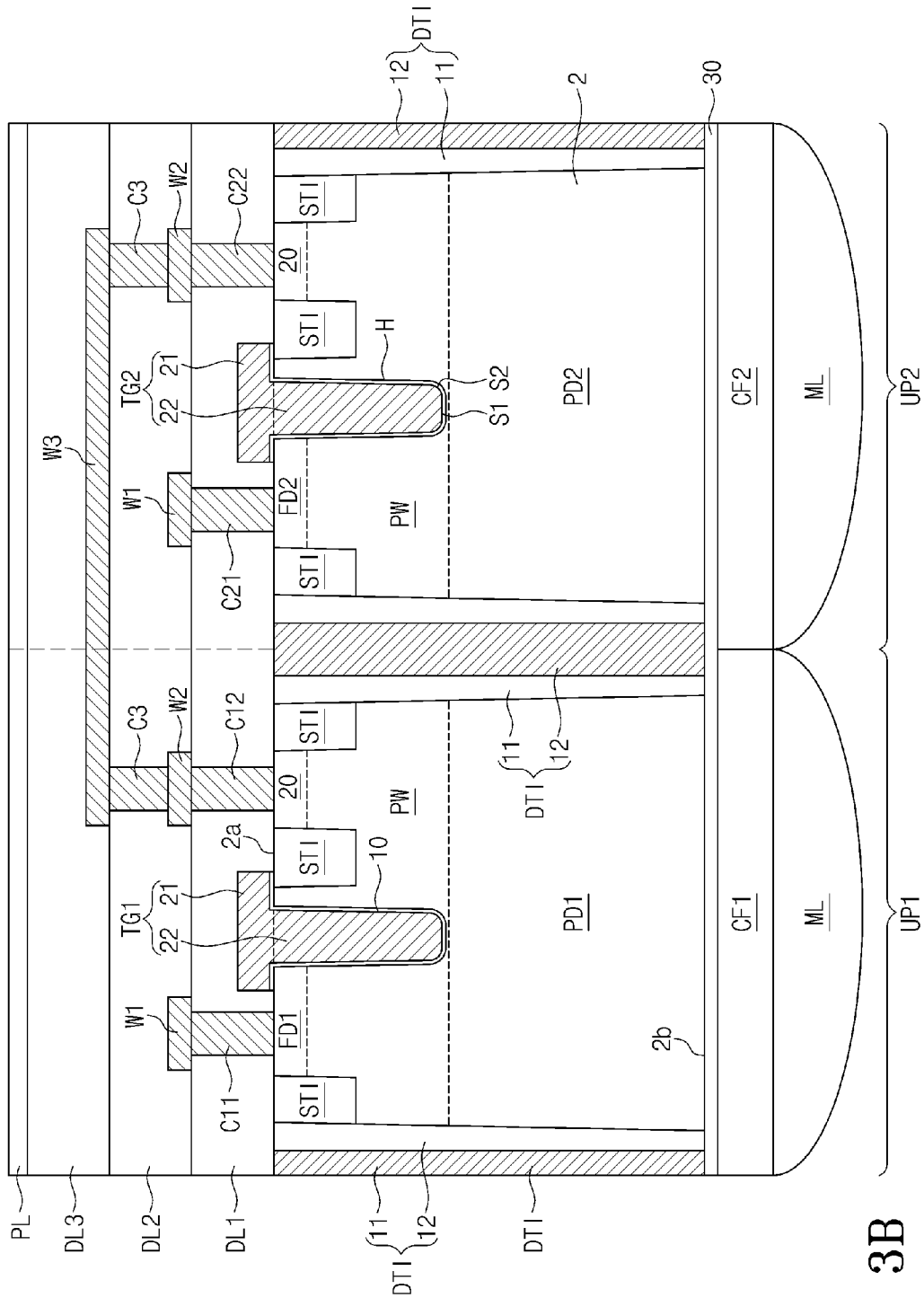
Figure 4:
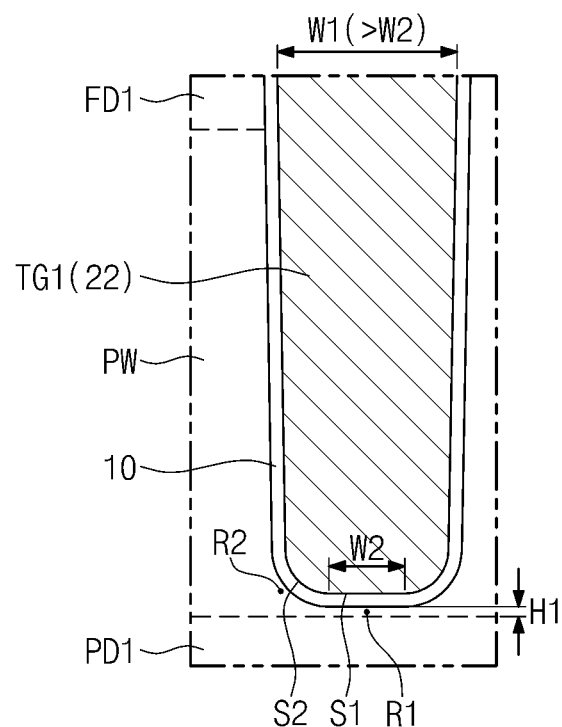
FIG. 4 is an enlarged sectional view of a portion B of FIG. 3A.

FIG. 2 is a layout illustrating an image sensor according to an example embodiment of the inventive concepts, FIGS. 3A and 3B are sectional views taken along a line A-A' of FIG. 2, and FIG. 4 is an enlarged sectional view of a portion B of FIG. 3A.

Referring to FIGS. 1, 2, 3A and 3B, a substrate 2 may be provided to include the first pixel region UP1 and the second pixel region UP2. The substrate 2 may be a silicon wafer or a silicon-on-insulator (SOI) substrate, or a substrate including a semiconductor epitaxial layer. The substrate 2 may include a first surface 2a and a second surface 2b facing each other. A deep device isolation layer DTI may be provided in the substrate 2 to separate the pixel regions UP1 and UP2 from each other. The deep device isolation layer DTI may be formed to have a height, which may be substantially equivalent to a thickness of the substrate 2. The deep device isolation layer DTI may be formed through the substrate 2 to connect the first surface 2a and the second surface 2b thereof to each other. The deep device isolation layer DTI may be formed of an insulating material, whose refractive index is different from that of the substrate 2. For example, as shown in FIG. 3A, the deep device isolation layer DTI may be formed of a silicon oxide layer. Alternatively, as shown in FIG. 3B, the deep device isolation layer DTI may include an insulating material 12 and a polysilicon layer 11 provided therein. A light incident at an angle to a specific pixel (e.g., the second pixel region UP2) may be incident a neighboring pixel (e.g., the first pixel region UP1) adjacent thereto. However, the deep device isolation layer DTI may reflect a light incident to the neighboring pixel (e.g., the first pixel region UP1) to the specific pixel (e.g., the second pixel region UP2). As a result, cross talk may be prevented from occurring between the pixels arranged adjacent to each other. Furthermore, since the deep device isolation layer DTI is formed to penetrate the substrate 2, the pixel regions may be completely separated from each other, and thus, it is possible to prevent the cross talk effectively. In addition, the photoelectric conversion parts PD1 and PD2 may be formed to be in contact with a sidewall of the deep device isolation layer DTI and each of them may have the same area as the pixel region, and this enables to increase an area of a light-receiving region and improve a fill factor.

A plurality of transistors Tx1, Tx2, Rx, Dx, and Sx and a plurality of wires may be provided on the first surface 2a. A light may be incident to the second surface 2b. The photoelectric conversion parts PD1 and PD2 may be provided in the substrate 2 of each of the first and second pixel regions UP1 and UP2. For example, the first photoelectric conversion part PD1 may be disposed in the first pixel region UP1, and the second photoelectric conversion part PD2 may be disposed in the second pixel region UP2. The photoelectric conversion parts PD1 and PD2 may be photodiodes. A well region PW may be provided on the photoelectric conversion parts PD1 and PD2. The well region PW may be doped to have a different or opposite conductivity type from the photoelectric conversion parts PD1 and PD2. For example, the well region PW may be doped with p-type impurities, while the photoelectric conversion parts PD1 and PD2 may be doped with n-type impurities.

Shallow device isolation layers STI may be provided on the well region PW to define active regions AR of the transistors Tx1, Tx2, Rx, Dx, and Sx. In the first pixel region UP1, the first transfer gate TG1, the source follower gate SF and the selection gate SEL may be provided on the first surface 2a of the substrate 2 to serve as gate electrodes of the first transfer transistor Tx1, the source follower transistor Dx, and the selection transistor Sx, respectively. In the second pixel region UP2, the second transfer gate TG2 and the reset gate RG may be provided on the first surface 2a of the substrate to serve as gate electrodes of the second transfer transistor Tx2 and the reset transistor Rx, respectively. A gate insulating layer 10 may be interposed between the gate electrodes TG1, TG2, SF, SEL, and RG and the substrate 2.

Next, the transfer gates TG1 and TG2 may be provided to have top surfaces spaced apart outward from the first surface 2a of the substrate 2 and bottom surfaces inserted into the well PW of the substrate 2. For example, each of the transfer gates TG1 and TG2 may include a protruding portion 21 protruding outward from the substrate 2 and a buried portion 22 extending from the protruding portion 21 to be inserted into the substrate 2. The floating diffusion regions FD1 and FD2 may be provided in the substrate 2 between upper side surfaces of the buried portion 22 and the shallow device isolation layer STI. For example, the first floating diffusion region FD1 may be provided on the first pixel region UP1, and the second floating diffusion region FD2 may be provided on the second pixel region UP2. The floating diffusion regions FD1 and FD2 may be doped to have a different or opposite conductivity type from the well region PW. For example, the floating diffusion regions FD1 and FD2 may be doped with n-type impurities.

A ground doped region 20 may be provided in a portion of the active region AR spaced apart from the transfer gates TG1 and TG2 by the shallow device isolation layer STI. The ground doped region 20 may be doped to have the same conductivity type as the well region PW. For example, the ground doped region 20 may be doped with p-type impurities. Here, the ground doped region 20 may have formed to have a doping concentration higher than that of the well region PW.

Referring to FIGS. 2 and 3A, contacts C11, C12, C13, C14, C15, C21, C22, C23, C24, and C3, wires W1, W12, and W2, interlayered insulating layers DL1, DL2, and DL3, and a passivation layer PL may be provided on the first surface 2a of the substrate 2. The first floating diffusion region FD1 and the second floating diffusion region FD2 may be electrically connected to each other via the eleventh contact C11, the twenty first contact C21, and the first wire W1. The first wire W1 may be disposed to electrically connect the twenty fourth contact C24 provided at a side of the reset gate RG with the fifteenth contact C15 connected to the source follower gate SF. For example, during the reset operation, a power voltage VDD may be applied to the twenty-third contact C23 provided at other side of the reset gate RG and the thirteenth contact C13 provided at a side of the source follower gate SF. The fourteenth contact C14 disposed at one side of the selection gate SEL may be connected to an output line for outputting an output signal Vout. The ground doped regions 20 of the pixel regions UP1 and UP2 may be connected in common to the twelfth contact C12, the twenty-second contact C22, the second wire W2, the third contact C3, and a third wire W3, and be applied with a ground voltage therethrough.

Referring to FIG. 3A, a protection layer 30 may be provided on the second surface 2b of the substrate 2. The protection layer 30 may be configured to have negative fixed charges, and this enables to reduce effectively a dark current of the image sensor. According to an example embodiment of the inventive concepts, the protection layer 30 may be formed of a metal oxide layer, which may be formed by oxidizing metallic elements, such as hafnium (Hf), zirconium (Zr), aluminum (Al), tantalum (Ta), titanium (Ti), yttrium (Y), and lanthanoids. In addition, the protection layer 30 may include at least one crystallized portion. In the case where the protection layer 30 has negative fixed charges or ions, holes may be accumulated at a lower region of the substrate 2. In a back-side illumination image sensor, surface defects may be formed on the second surface 2b of the substrate 2 during a fabricating process thereof, and the surface defects may lead to noise problems. However, in the case where the protection layer 30 is present, holes accumulated in the protection layer 30 may be used to passivate the surface defects. For example, electrons generated in a dark environment (i.e., a dark current) may be combined with the accumulated holes, and this enables to reduce the dark current. As a result, the optical sensor can be configured to have improved light-receiving efficiency and light sensitivity, even if a p+ region for a back-side passivation is not formed.

Color filters CF1 and CF2 and microlens ML may be provided below the protection layer 30. Each of the color filters CF1 and CF2 and each of the microlens ML may be disposed at the corresponding one of the pixel regions UP1 and UP2. The color filters CF1 and CF2 may be a portion of a color filter array including a plurality of color filters arranged in the form of matrix. According to an example embodiment of the inventive concepts, the color filter array may be provided to form the Bayer pattern including a red filter, a green filter, and a blue filter. In other embodiments, the color filter array may be configured to include a yellow filter, a magenta filter and a cyan filter. In certain embodiments, the color filter array may further include a white filter.

Referring to FIG. 4, the gate insulating layer 10 may be interposed between the bottom surfaces S1 of the buried portions 22 of the transfer gates TG1 and TG2 and the substrate 2, and be spaced apart from the photoelectric conversion parts PD1 and PD2 positioned thereunder. According to an example embodiment of the inventive concepts, a distance H1 between the gate insulating layer 10 and the photoelectric conversion parts PD1 and PD2 may be selected in such a way that the photoelectric conversion parts PD1 and PD2 can be effectively controlled by an electric field from the transfer gates TG1 and TG2. For example, if the distance H1 is too small or the gate insulating layer 10 is formed to be in contact with the top surfaces of the photoelectric conversion part PD1 and PD2, a leakage current may be produced by dangling bonds of the gate insulating layer 10. According to an example embodiment of the inventive concepts, the gate insulating layer 10 may be formed to have the distance H1 ranging from about 300 Å to about 500 Å, and in this case, the electric field from the transfer gates TG1 and TG2 can be effectively transferred to the photoelectric conversion parts PD1 and PD2 and the leakage current can be prevented from occurring.

Referring to FIG. 4, the bottom surface S1 of the buried portion 22 may be flat. A top width of the buried portion 22 (hereinafter, referred as to a first width W1) may be greater than a width of the flat bottom surface S1 (hereinafter, referred as to a second width W2). For example, the first width W1 may be 200 nm or more. The second width W2 may be half the first width W1. According to an example embodiment of the inventive concepts, the second width W2 may be 100 nm or more. In the case that the second width W2 is 100 nm or more, an electric field from the transfer gates TG1 and TG2 can be effectively transferred to the photoelectric conversion parts PD1 and PD2. Otherwise, the flat bottom surface S1 of the buried portion 22 may be formed to have a small area in the case where the second width W2 is less than 100 nm, there may be a difficulty in transferring an electric field from the transfer gates TG1 and TG2 to the photoelectric conversion parts PD1 and PD2. This may lead to a difficulty in transferring electric charges accumulated in the photoelectric conversion parts PD1 and PD2 to the floating diffusion regions.

Figure 5A:
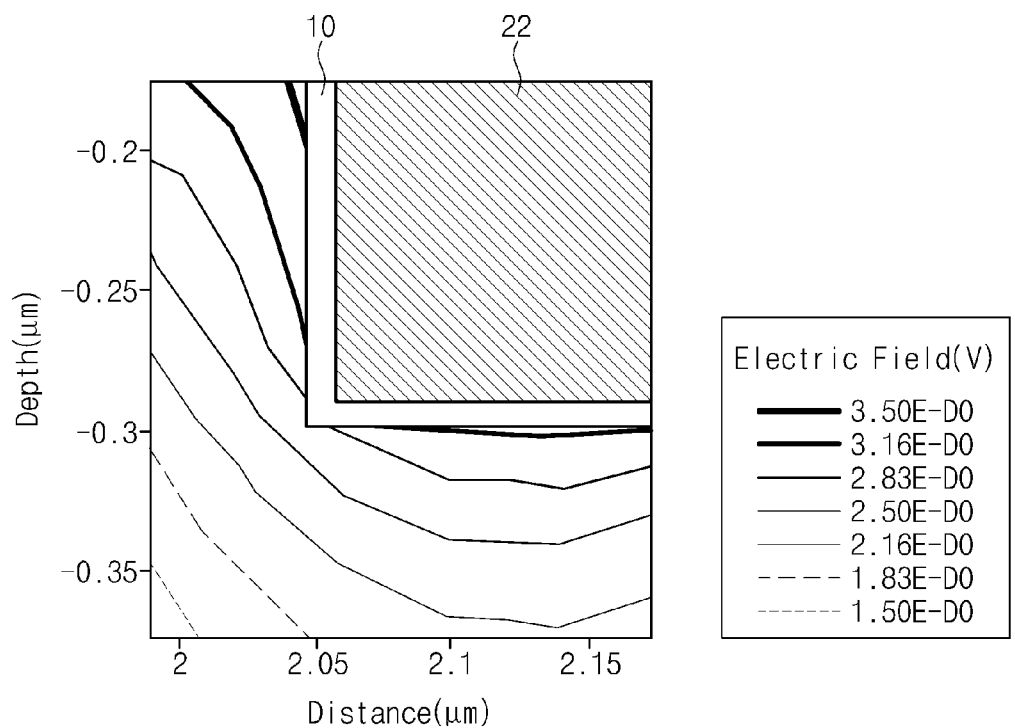
FIG. 5A is a diagram showing a simulated distribution of a neighboring electric field obtained from the case of a sharp bottom corner of a gate electrode.
Figure 5B:
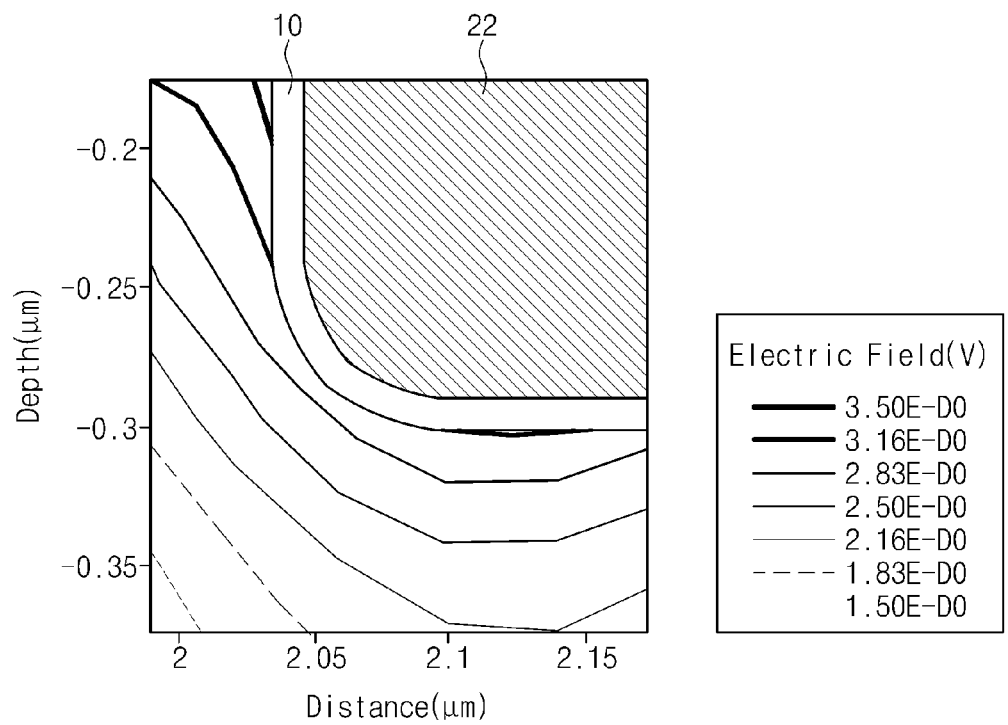
FIG. 5B is a diagram showing a simulated distribution of a neighboring electric field obtained from the case of a rounded bottom corner of a gate electrode.

FIG. 5A is a diagram showing a simulated distribution of a neighboring electric field obtained from the case of a sharp bottom corner of a gate electrode. FIG. 5B is a diagram showing a simulated distribution of a neighboring electric field obtained from the case of a rounded bottom corner of a gate electrode.

As shown in FIGS. 4 and 5B, a lower corner S2 of the buried portion 22 may be formed to have a rounded profile. In this case, an electric field may have a uniform distribution around the buried portion 22. For example, there is substantially no difference in electric field between a point R2 adjacent to the rounded corner S2 and a point R1 adjacent to the flat bottom surface S1. By contrast, as shown in FIG. 5A, in the case where the lower corner S2 of the buried portion 22 is formed to have a sharp profile, an electric field may have a non-uniform distribution around the buried portion 22. For example, there is a difference in electric field between the points R1 and R2. This difference in electric field may serve as a potential barrier preventing electric charges accumulated in the photoelectric conversion parts PD1 and PD2 from being transferred to the floating diffusion regions.

Figure 5C:
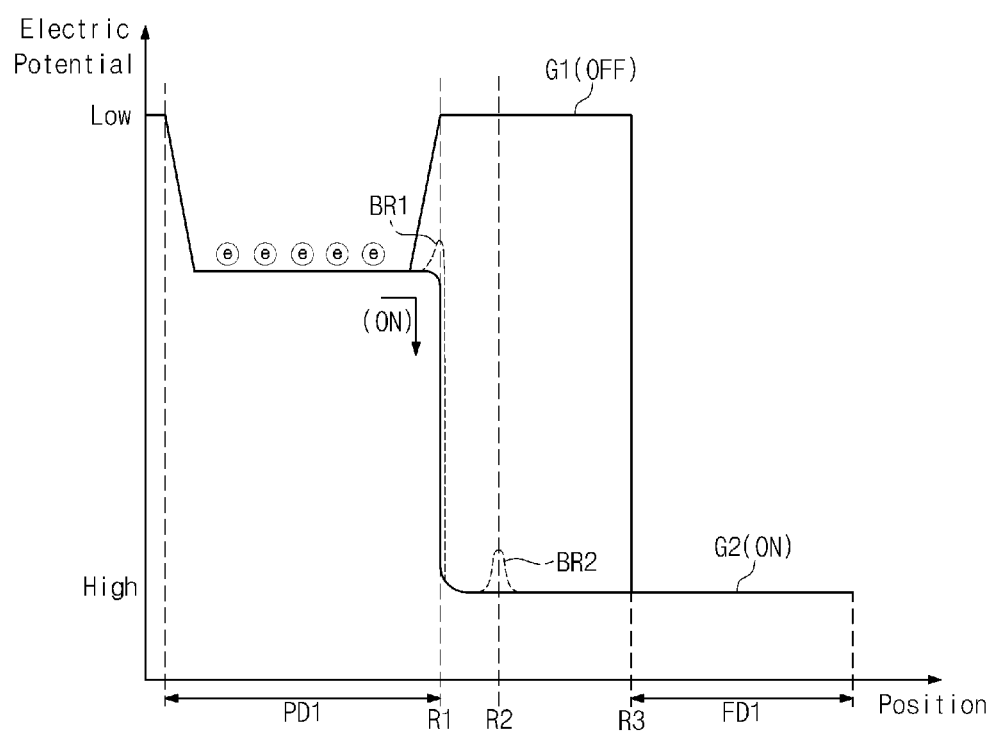
FIG. 5C is a graph showing a spatial variation of electric potential in a pixel region.

FIG. 5C is a graph showing a spatial variation of electric potential in a pixel region.

Referring to FIGS. 4 and 5C, if the transfer gates TG1 and TG2 are not applied with a voltage or the transfer transistors Tx1 and Tx2 are in the off-state, positions R1, R2, and R3 of the substrate 2 adjacent to the buried portion 22 may have a low electric potential. As a result, as depicted by a first curve G1 electric charges (e) stored in the photoelectric conversion parts PD1 and PD2 cannot be transferred into the floating diffusion regions FD1 and FD2. In the case where the transfer gates TG1 and TG2 are applied with a voltage or the transfer transistors Tx1 and Tx2 are in the on-state, the positions R1, R2, and R3 may have a high electric potential, and in this case, as depicted by a second curve G2, the electric charges (e) stored in the photoelectric conversion parts PD1 and PD2 can be transferred into the floating diffusion regions FD1 and FD2. However, if the flat bottom surface S1 has a width W2 smaller than 100 nm, a first barrier region BR1 may be formed at the first position R1. In addition, if the lower corner S2 has a sharp profile, a second barrier region BR2 may be formed at the second position R2. The formation of the first and second barrier regions BR1 and BR2 make it difficult to transfer electric charges to the floating diffusion regions FD1 and FD2.

However, according to an example embodiment of the inventive concepts, the buried portions 22 of the transfer gates TG1 and TG2 may be formed to have the flat bottom surface S1 and the rounded lower corner, and this enables the transfer of electric charges stored in the photoelectric conversion parts PD1 and PD2 to the floating diffusion regions FD1 and FD2. As a result, it is possible to reduce the image lag problem.

FIGS. 6 through 11 are sectional views illustrating a process of fabricating the image sensor of FIG. 3A.

Referring to FIG. 6, the second substrate 2 may be formed on the first substrate 1. For example, the first substrate 1 may be a silicon wafer, and the second substrate 2 may be a silicon epitaxial layer.

Referring to FIG. 7, ion implantation processes may be performed to form the photoelectric conversion parts PD1 and PD2 and the well region PW in the second substrate 2. Thereafter, the second substrate 2 may be etched to form a deep trench exposing the first substrate 1, and the deep trench may be filled with an insulating material to form the deep device isolation layer DTI. Here, as shown in FIG. 3B, a polysilicon layer may be further formed in the deep device isolation layer DTI. In other embodiments, the photoelectric conversion parts PD1 and PD2 and the well region PW may be formed after the formation of the deep device isolation layer DTI.

Figure 8:
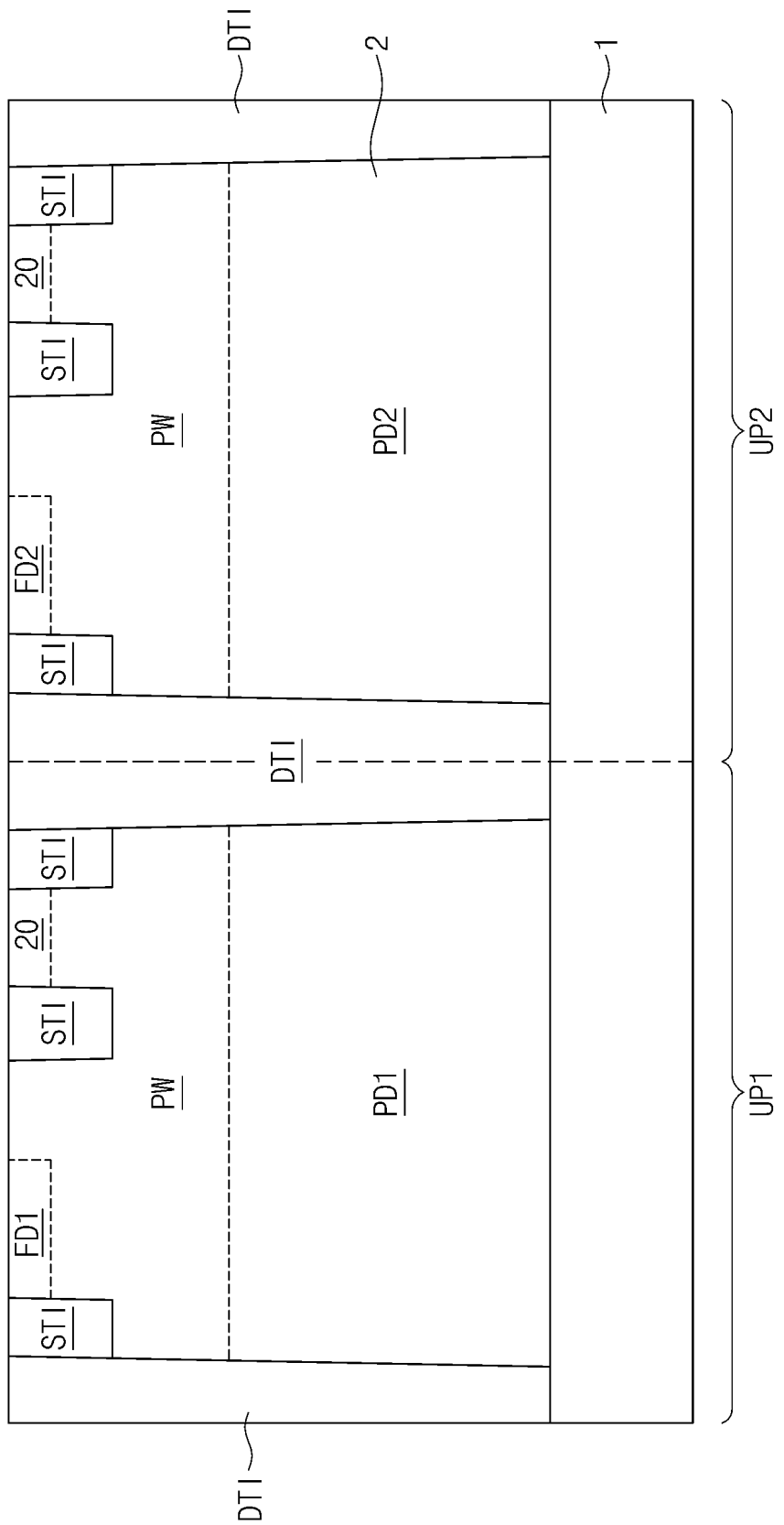

Referring to FIGS. 2 and 8, the second substrate 2 may be partially etched to form a shallow trench, and then, the shallow trench may be filled with an insulating material to form the shallow device isolation layer STI defining the active regions AR of the transistors Tx1, Tx2, Rx, Dx, and Sx. Next, ion implantation processes may be performed to form the floating diffusion regions FD1 and FD2 and the ground doped region 20 in the active regions AR.

Figure 9:
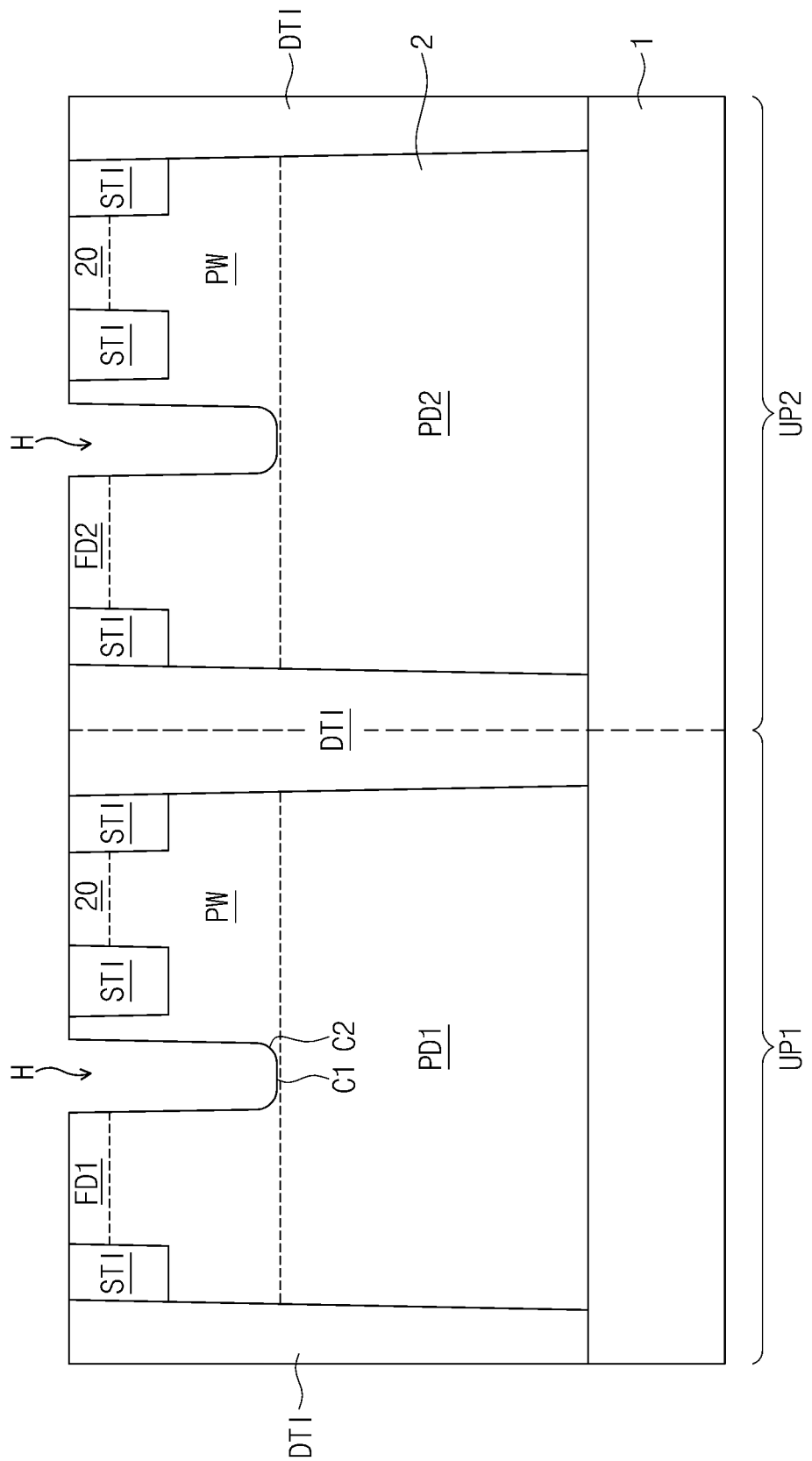

Referring to FIG. 9, the second substrate 2 adjacent to the floating diffusion regions FD1 and FD2 may be etched to form a hole H. According to an example embodiment of the inventive concepts, the hole H may be formed to have a flat bottom surface C1 and a rounded lower corner C2. For example, the formation of the hole H may include performing an anisotropic etching process to form a sharp corner of the hole and performing an isotropic etching process to round the sharp corner of the hole. Alternatively, the formation of the hole H may include performing the anisotropic etching process to form a sharp corner of the hole, performing a thermal oxidation process to form a thermal oxide layer, and then, removing the thermal oxide layer. As the result of the removal of the thermal oxide layer, the hole H can be formed to have the flat bottom surface C1 and the rounded lower corner C2. According to an example embodiment of the inventive concepts, the hole H may be formed to expose sidewalls of the floating diffusion regions FD1 and FD2. The flat bottom surface C1 may be formed spaced apart from the photoelectric conversion parts PD1 and PD2.

Figure 10:
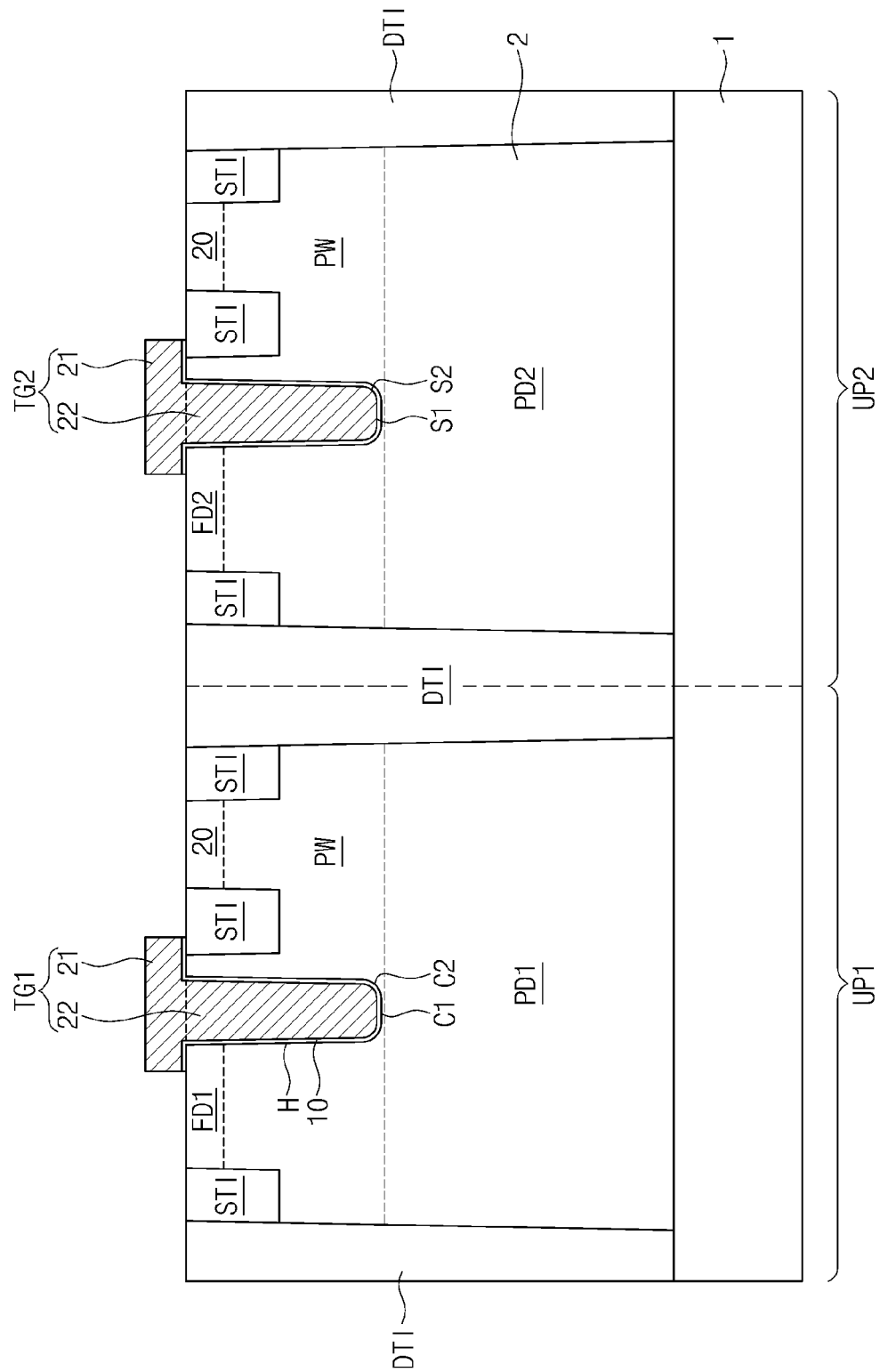

Referring to FIGS. 2 and 10, a thermal oxidation process may be performed to form a thermal oxide layer on the first surface 2a of the second substrate 2. A conductive layer may be deposited to fill the hole H. The conductive layer and the thermal oxide layer may be continuously etched to form the transfer gates TG1 and TG2 and the gate insulating layer 10, respectively. Here, each of the transfer gates TG1 and TG2 may be formed to include the buried portion 22 inserted into the hole H and the protruding portion 21 protruding from the second substrate 2. According to an example embodiment of the inventive concepts, the reset gate RG, the source follower gate SF, and the selection gate SEL may be formed using the process of forming the transfer gates TG1 and TG2. However, the reset gate RG, the source follower gate SF, and the selection gate SEL may be formed not to include the buried portion 22; that is, the reset gate RG, the source follower gate SF, and the selection gate SEL may be formed on the second substrate 2 to have a planar structure.

Figure 11:
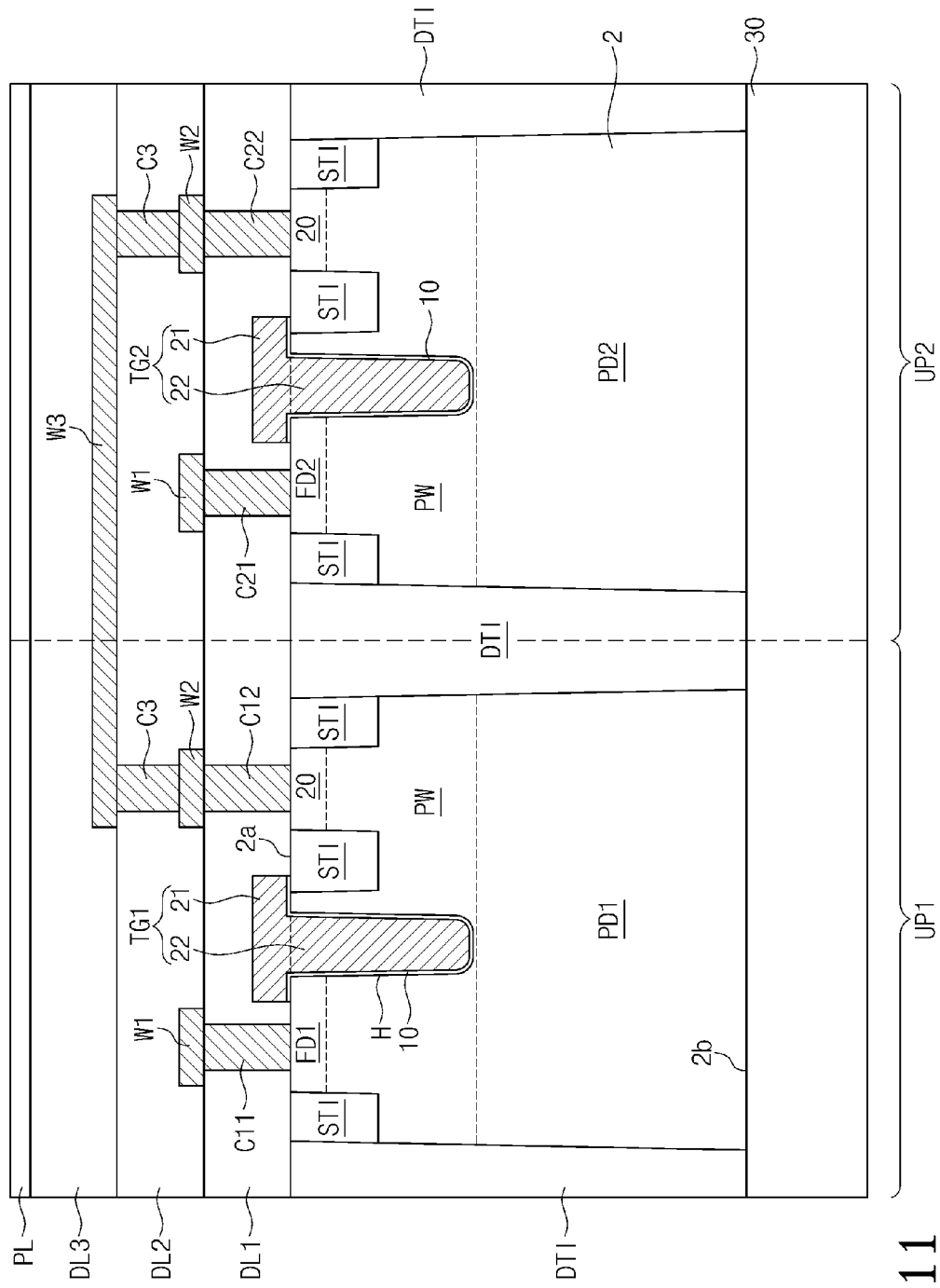

Referring to FIGS. 2 and 11, a first interlayered insulating layer DL1 may be formed to cover the first surface 2a of the second substrate 2. Thereafter, the eleventh contact C11, the twenty-first contact C21, and the twelfth and twenty-second contacts C12 and C22 may be formed through the first interlayered insulating layer DL1. The eleventh contact C11 may be connected to the first floating diffusion region FD1, the twenty-first contact C21 may be connected to the second floating diffusion region FD2, and the twelfth and twenty-second contacts C12 and C22 may be connected to the ground doped region 20. During this process, the thirteenth contact C13 may be formed at one side of the source follower gate SF, the fourteenth contact C14 may be formed at one side of the selection gate SEL, and the twenty-third contact C23 and the twenty-fourth contact C24 may be formed at both sides of the reset gate RG, respectively. In addition, the fifteenth contact C15 may be formed during this process, and the fifteenth contact C15 may be connected to the source follower gate SF through the first interlayered insulating layer DL1.

The first wire W1 may be formed on the first interlayered insulating layer DL1 to connect the eleventh contact C11, the twenty-first contact C21, the twenty-fourth contact C24, and the fifteenth contact C15 with each other. In addition, the second wire W2 may be formed on the first interlayered insulating layer DL1 to be in contact with the twelfth and twenty-second contacts C12 and C22. The second interlayered insulating layer DL2 may be formed on the first interlayered insulating layer DL1, and then, the third contact C3 may be formed through the second interlayered insulating layer DL2 to be connected to the second wire W2. The third wire W3 may be formed on the second interlayered insulating layer DL2 and be connected to the third contact C3. Thereafter, the third interlayered insulating layer DL3 and the passivation layer PL may be formed on the structure provided with the third wire W3.

The first and second floating diffusion regions FD1 and FD2 may be electrically connected to each other by the eleventh contact C11, the twenty-first contact C21, and the first wire W1. The first wire W1 may be configured to connect the twenty-fourth contact C24 disposed at one side of the reset gate RG to the fifteenth contact C15 connected to a top surface of the source follower gate SF. For example, during the reset operation, a power voltage VDD may be applied to the twenty-third contact C23 provided at other side of the reset gate RG and the thirteenth contact C13 provided at one side of the source follower gate SF. The fourteenth contact C14 disposed at one side of the selection gate SEL may be connected to an output line for outputting an output signal Vout. The ground doped regions 20 of the pixel regions UP1 and UP2 may be connected in common to the twelfth contact C12, the twenty-second contact C22, the second wire W2, the third contact C3, and the third wire W3, and be applied with a ground voltage therethrough.

Referring back to FIG. 3A, the first substrate 1 may be removed to expose the second substrate 2. The protection layer 30, the color filters CF1 and CF2, and the microlens ML may be sequentially formed on the second surface 2b of the second substrate 2.

Figure 12:
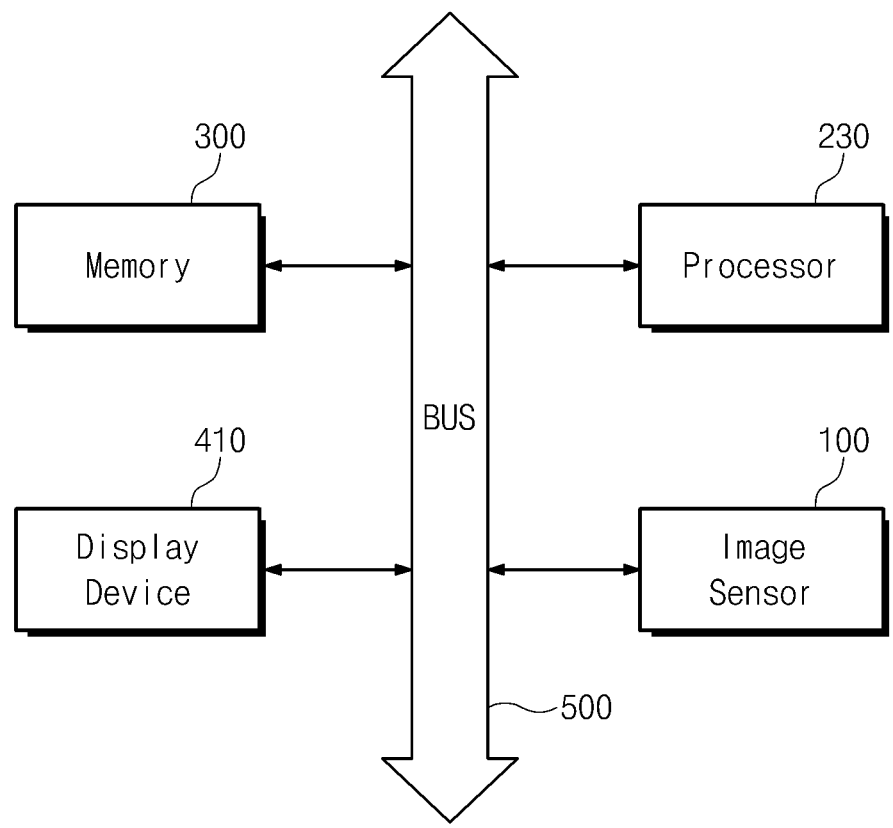
FIG. 12 is a block diagram illustrating an electronic device having an image sensor, according to an example embodiment of the inventive concepts.
Figure 13:
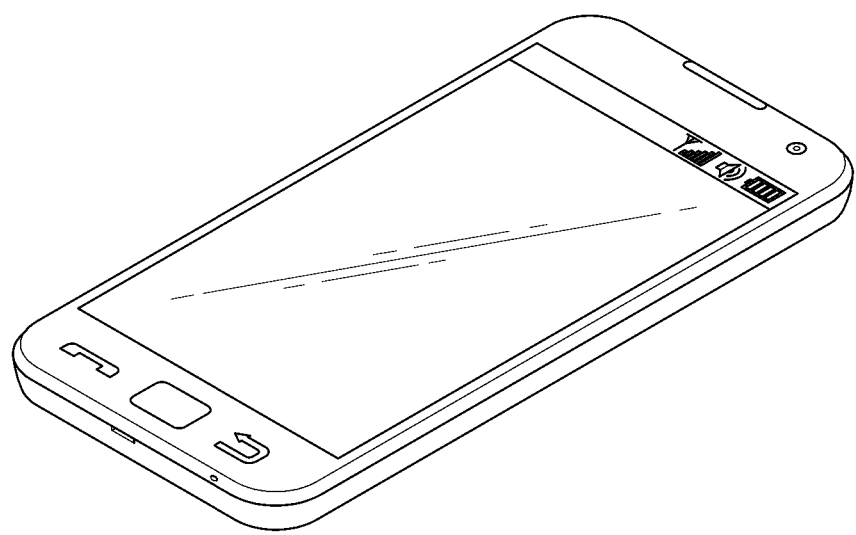
FIGS. 13 through 17 show examples of multimedia devices, to which image sensors according to an example embodiment of the inventive concepts can be applied.
Figure 14:
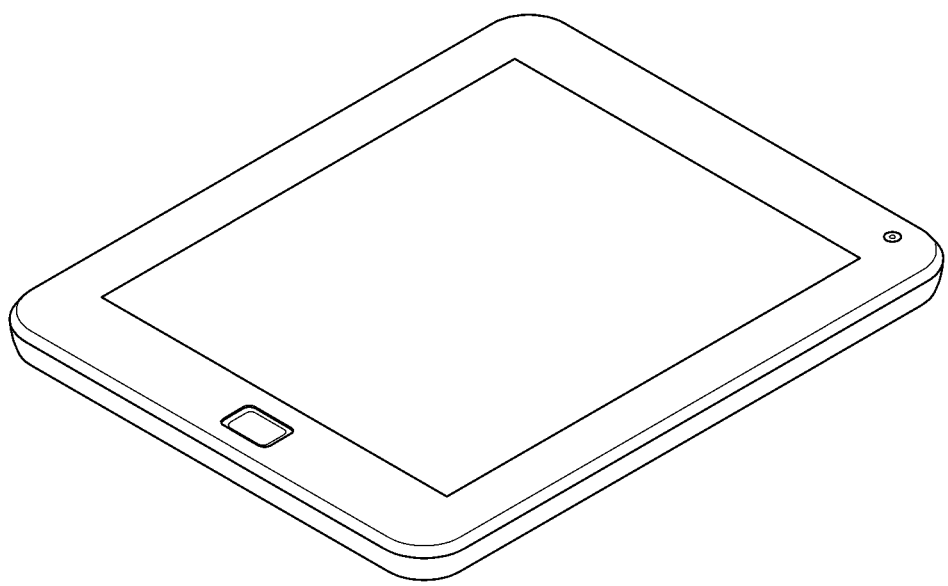
Figure 15:
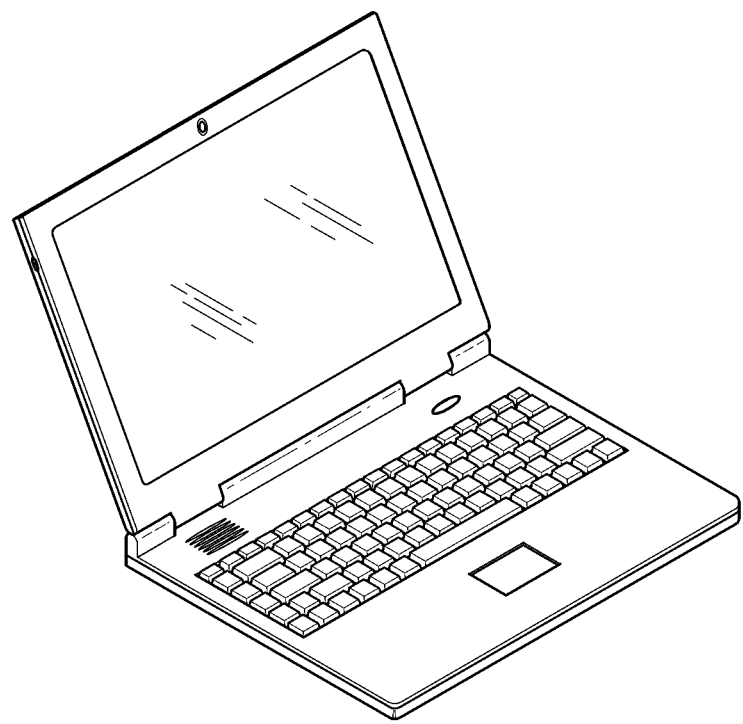
Figure 16:
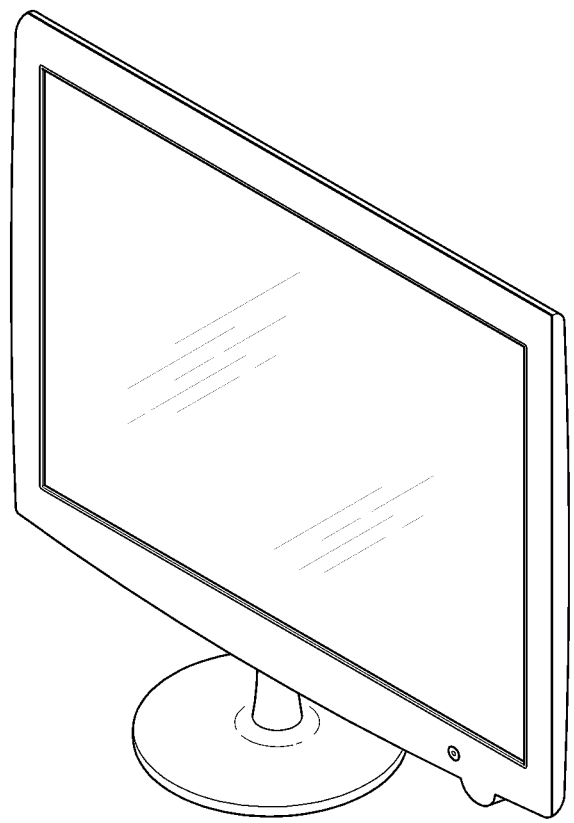
Figure 17:
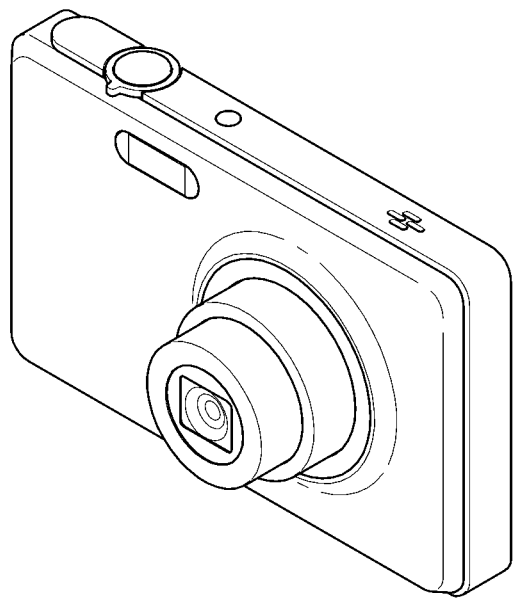

FIG. 12 is a block diagram illustrating an electronic device having an image sensor, according to an example embodiment of the inventive concepts. The electronic device may be any of various types of devices, including for example a digital camera or a mobile device, for example.

Referring to FIG. 12, an illustrative digital camera system includes an image sensor 100, a processor 230, a memory 300, a display 410 and a bus 500. As shown in FIG. 12, the image sensor 100 captures an external image under control of the processor 230, and provides the corresponding image data to the processor 230 through the bus 500. The processor 230 may store the image data in the memory 300 through the bus 500. The processor 230 may also output the image data stored in the memory 300, e.g., for display on the display device 410.

FIGS. 13 through 17 show examples of multimedia devices, to which image sensors according to example embodiments of the inventive concepts can be applied. Image sensors according to example embodiments of the inventive concepts can be applied to a variety of multimedia devices with an imaging function. For example, image sensors according to an example embodiment of the inventive concepts may be applied to a mobile phone or a smart phone 2000 as exemplarily shown in FIG. 13, to a tablet PC or a smart tablet PC 3000 as exemplarily shown in FIG. 14, to a laptop computer 4000 as exemplarily shown in FIG. 15, to a television set or a smart television set 5000 as exemplarily shown in FIG. 16, and to a digital camera or a digital camcorder 6000 as exemplarily shown in FIG. 17.

According to an example embodiment of the inventive concepts, the transfer gate of the image sensor may be configured to include the buried portion having a flat bottom surface and a rounded lower corner. Due to this structure of the buried portion, electric charges stored in the photoelectric conversion part can be transferred effectively. As a result, it is possible to reduce the image lag problem.

In addition, the image sensor may include the deep device isolation layer completely separating the pixel regions from each other, and this enables to reduce cross talk between adjacent pixels. Further, the photo diode is provided to occupy the entire lower portion of each of the pixel regions. In other words, the photo diode can be formed to have the same area as that of the pixel region. This enables to increase an area of a light-receiving region and improve a fill factor.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. An image sensor, comprising:
  a substrate including first and second surfaces facing each other and a plurality of pixel regions, the plurality of pixel regions being configured such that, when the second surface is exposed to a light, the light is incident on the pixel regions through the second surface;
  photoelectric conversion parts in the pixel regions of the substrate, respectively; and gate electrodes provided on the photoelectric conversion parts, at least one of the gate electrodes on at least a first photoelectric conversion part, from among the photoelectric conversion parts, including a buried portion in the substrate, the buried portion including a flat bottom surface and a rounded lower corner, the first photoelectric conversion part being in a first pixel region, from among the plurality of pixel regions, at least the first pixel region, from among the plurality of pixel regions, including an isolation pattern separating the first pixel region from other pixel regions of the plurality of pixel regions, the isolation pattern including,
 a first portion that is on a first side of the first pixel region, and penetrates the substrate to connect the first surface and the second surface with each other;
 a second portion that is on a side surface of the first portion, extends from the first surface towards the second surface of the substrate, and is spaced apart from the second surface of the substrate;
 a third portion that is on a second side of the first pixel region opposite from the first side of the first pixel region, and penetrates the substrate to connect the first surface and the second surface with each other; and
 a fourth portion that is on a side surface of the third portion, extends from the first surface towards the second surface of the substrate, and is spaced apart from the second surface of the substrate, at least the first pixel region, from among the plurality of pixel regions, further including,
 a ground doped region, and
 a shallow isolation portion that is in between the ground doped region and the buried portion, extends from the first surface towards the second surface of the substrate, and is spaced apart from the second surface of the substrate.

2. The image sensor of claim 1, wherein the flat bottom surface of the buried portion has a width of 100 nm or more.

3. The image sensor of claim 1, further comprising:
a gate insulating layer interposed between the at least one gate electrode and the substrate,
wherein the gate insulating layer is spaced apart from the at least one photoelectric conversion part.

4. The image sensor of claim 1, wherein the at least one photoelectric conversion part is in contact with a sidewall of the first portion.

5. The image sensor of claim 1, wherein the first portion comprises:
an insulating material, the insulating material having a refractive index different from that of the substrate.

6. The image sensor of claim 5, wherein the first portion further comprises:
a polysilicon layer inserted into the insulating material.

7. The image sensor of claim 1, wherein the second portion defines active regions.

8. The image sensor of claim 7, further comprising:
one or more floating diffusion regions, the one or more floating diffusion regions being in the substrate and between sidewalls of the second portion and the at least one gate electrode; and
a well region, the well region being in the substrate and between the one or more floating diffusion regions and the at least one photoelectric conversion part.

9. The image sensor of claim 8, wherein
the one or more floating diffusion regions and the at least one photoelectric conversion part have a first conductivity type, and
the well region has a second conductivity type that is opposite to the first conductivity type.

10. The image sensor of claim 8, wherein at least two of the one or more floating diffusion regions in adjacent ones of the pixel regions are electrically connected to each other.

11. The image sensor of claim 1, further comprising:
color filters on the second surface, the color filters corresponding to the pixel regions, respectively, each of the color filters being disposed on the corresponding one of the pixel regions; and
microlenses on the color filters, respectively.

12. The image sensor of claim 11, further comprising:
a layer disposed between at least one of the color filters and the second surface, wherein the layer is configured to have negative fixed charges.

13. An image sensor comprising:
a substrate including a first surface, a second surface opposite the first surface, and a plurality of pixel regions, each of the pixel regions including,
 a photoelectric conversion region spaced apart from the first surface of the substrate, and
 a gate electrode on the first surface of the substrate, the gate electrode including a lower portion that extends into the substrate from the first surface of the substrate towards the photoelectric conversion region, the lower portion of the gate electrode including a flat bottom surface and a rounded lower corner; and
a deep device isolation layer extending through the substrate from the first surface to the second surface,
the plurality of pixel regions being separated from each other by the deep device isolation layer,
the plurality of pixel regions being structured such that, for each of the plurality of pixel regions,
 the photoelectric conversion region included in the pixel region extends horizontally in a direction parallel to the first surface from a first portion of the deep device isolation layer on a first side of the pixel region to a second portion of the deep device isolation layer on a second side of the pixel region such that the photoelectric conversion region covers an entire width of the pixel region between the first and second portions of the deep device isolation layer, the second side being opposite to the first side,
 each of the first and second portions of the deep device isolation layer on the first and second sides of the pixel region, respectively, include,
  a first portion that is on a first side of the first pixel region, and penetrates the substrate to connect the first surface and the second surface with each other, and
  a second portion that is on a side surface of the first portion, extends from the first surface towards the second surface of the substrate, and is spaced apart from the second surface of the substrate, and
 the pixel region includes,
  a ground doped region, and
  a shallow isolation portion that is in between the ground doped region and the buried portion of the gate electrode of the pixel region, extends from the first surface towards the second surface of the substrate, and is spaced apart from the second surface of the substrate.

14. The image sensor of claim 13,
wherein the second portion is adjacent to the first surface of the substrate and is spaced apart from a top surface of the photoelectric conversion region, and the top surface is a surface of the photoelectric conversion region closest to the gate electrode.

15. The image sensor of claim 14, wherein each of the pixel regions further include,
a floating diffusion region, the floating diffusion region being in the substrate and between sidewalls of the second portion and the gate electrode; and
a well region, the well region being in the substrate and between the floating diffusion region and the photoelectric conversion region.

16. An image sensor, comprising:
a substrate including first and second surfaces facing each other and a plurality of pixel regions, the plurality of pixel regions being configured such that, when the second surface is exposed to a light, the light is incident on the pixel regions through the second surface;
photoelectric conversion parts formed in the pixel regions of the substrate, respectively; and
gate electrodes provided on the photoelectric conversion parts, at least one of the gate electrodes on at least a first photoelectric conversion part, from among the photoelectric conversion parts, including a buried portion in the substrate,
the buried portion including a flat bottom surface and a rounded lower corner,
the first photoelectric conversion part being in a first pixel region, from among the plurality of pixel regions,
at least the first pixel region, from among the plurality of pixel regions, including an isolation pattern penetrating the substrate and having a staircase shaped sidewall,
the isolation pattern separating the plurality of pixel regions from each other,
the isolation pattern including,
a first portion that is on a first side of the first pixel region, and penetrates the substrate to connect the first surface and the second surface with each other,
a second portion that is on a side surface of the first portion, extends from the first surface towards the second surface of the substrate, and is spaced apart from the second surface of the substrate,
a third portion that is on a second side of the first pixel region opposite from the first side of the first pixel region, and penetrates the substrate to connect the first surface and the second surface with each other, and
a fourth portion that is on a side surface of the third portion, extends from the first surface towards the second surface of the substrate, and is spaced apart from the second surface of the substrate,
at least the first pixel region, from among the plurality of pixel regions, further including,
a ground doped region, and
a shallow isolation portion that is in between the ground doped region and the buried portion, extends from the first surface towards the second surface of the substrate, and is spaced apart from the second surface of the substrate.

17. The image sensor of claim 16, further comprising:
color filters on the second surface of the substrate, the color filters corresponding to the pixel regions, respectively; and
a layer disposed between at least one of the color filters and the second surface, wherein the layer is configured to have negative fixed charges.

18. The image sensor of claim 16, wherein the isolation pattern includes a material having a refractive index different from that of a material of the substrate.

19. The image sensor of claim 16, wherein the plurality of pixel regions share a reset transistor and a source follower transistor.

20. The image sensor of claim 16, wherein the isolation pattern has a first width adjacent to the first surface of the substrate and a second width adjacent to the second surface, the second width being narrower than the first width.

* * * * *